(12) United States Patent
Nakamura et al.

(10) Patent No.: US 7,747,426 B2
(45) Date of Patent: Jun. 29, 2010

(54) SYSTEM SIMULATION USING MULTI-TASKING COMPUTER CODE

(75) Inventors: Hiroaki Nakamura, Kanagawa-ken (JP); Naoto Sato, Kanagawa-ken (JP); Naoshi Tabuchi, Tokyo (JP); Hiroshi Ishikawa, Shizuoka-ken (JP)

(73) Assignee: International Business Machines Corporation, Armonk, NY (US)

( * ) Notice: Subject to any disclaimer, the term of this patent is extended or adjusted under 35 U.S.C. 154(b) by 1068 days.

(21) Appl. No.: 11/292,775

(22) Filed: Dec. 2, 2005

(65) Prior Publication Data

US 2007/0129929 A1    Jun. 7, 2007

(51) Int. Cl.
*G06F 17/50* (2006.01)
(52) U.S. Cl. .............................. 703/19; 703/6; 703/13; 703/22
(58) Field of Classification Search ............ 703/13, 703/19, 22, 6; 718/100, 102
See application file for complete search history.

(56) References Cited

U.S. PATENT DOCUMENTS 6,117,181 A * 9/2000 Dearth et al. ................ 703/22
7,133,820 B2 * 11/2006 Pennello et al. ............. 703/22
7,308,393 B2 * 12/2007 Lumpkin et al. ............ 703/13

FOREIGN PATENT DOCUMENTS

JP    2003177943 A    6/2003

OTHER PUBLICATIONS

Simjava, A Guide to the simjava Package, http://www.dcs.ed.ac.uk/home/hase/simjava/, printed from Internet on Nov. 30, 2005.
F. Bruschi et al., "Error simulation based on the SystemC design description language" (abstract), Procs. of the 2002 Design, Automation, and Test in Europe Conf & Exh., 2002.
A. Gerstlauer et al., "RTOS modeling for system level design," Proceedings of Design, Automation and Test in Europe, Mar. 2003.
R. Domer et al., "SpecC Language Reference Manual," version 2.0, www.specc.org, Dec. 12, 2002.
Object Management Group, "UML Profile for Schedulability, Performance, and Time Specification," version 1.0, formal/03-09-1, Sep. 2003.

* cited by examiner

*Primary Examiner*—Kamini S Shah
*Assistant Examiner*—Herng-Der Day
(74) *Attorney, Agent, or Firm*—Vazken Alexanian

(57) ABSTRACT

A system, such as hardware or software system having a number of modules, is simulated using multi-tasking computer code. Simulation computer code launches tasks simulating system execution, where each task corresponds to a module. Each task requests a processing delay to a common scheduler. Upon the common scheduler receiving a processing delay request, the common scheduler instructs a scheduling method processor to update a task-remaining time for at least one task. The scheduling method processor updates the task-remaining time for at least one task based at least on a scheduling approach. The common scheduler sends a wait request to a preexisting simulation system to delay a module that corresponds to the task by a length of time, based on the task-remaining time for the task and the scheduling approach. The preexisting simulation system delays the module that corresponds to the task by the length of time of the wait request.

13 Claims, 10 Drawing Sheets

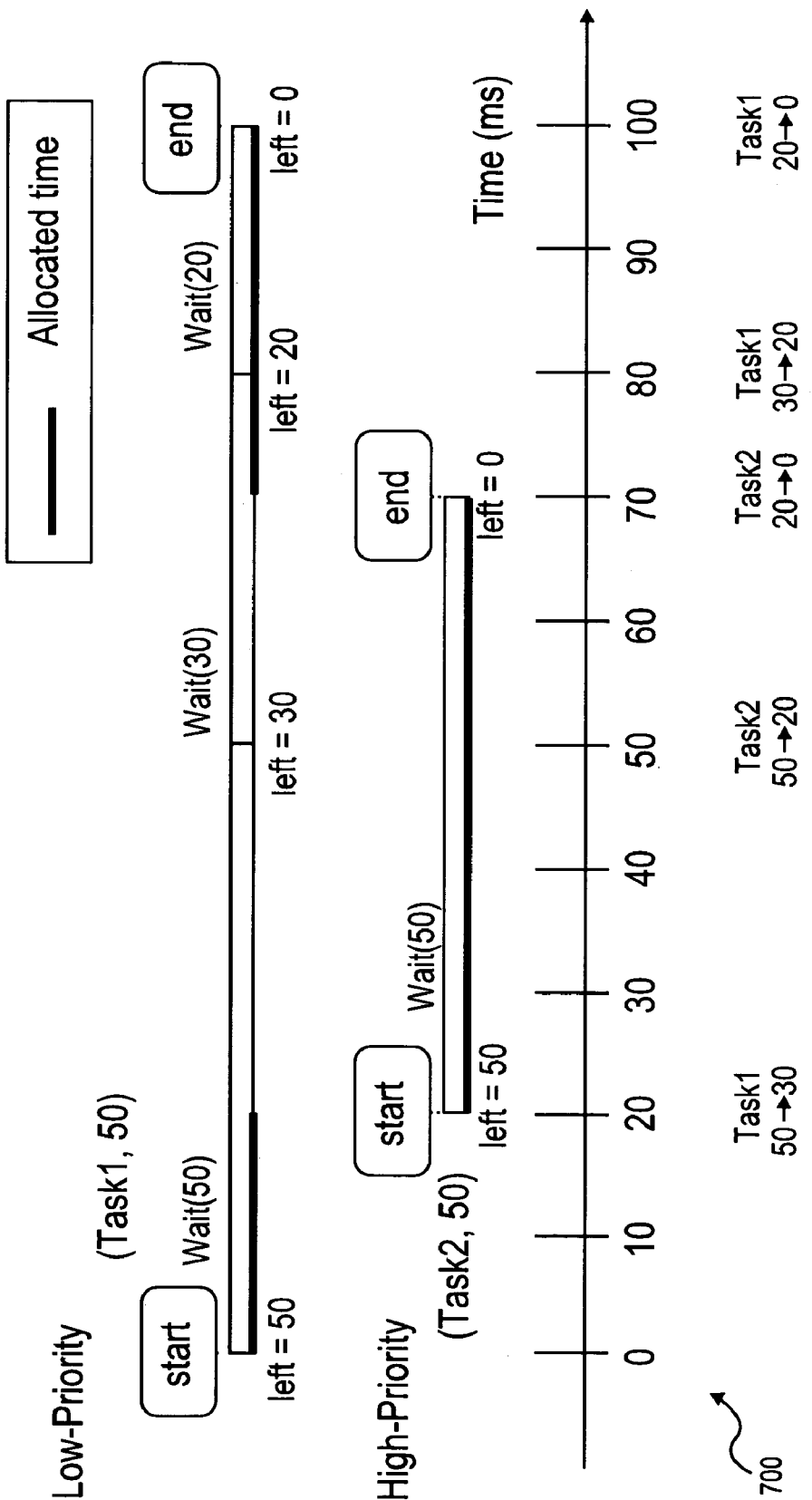

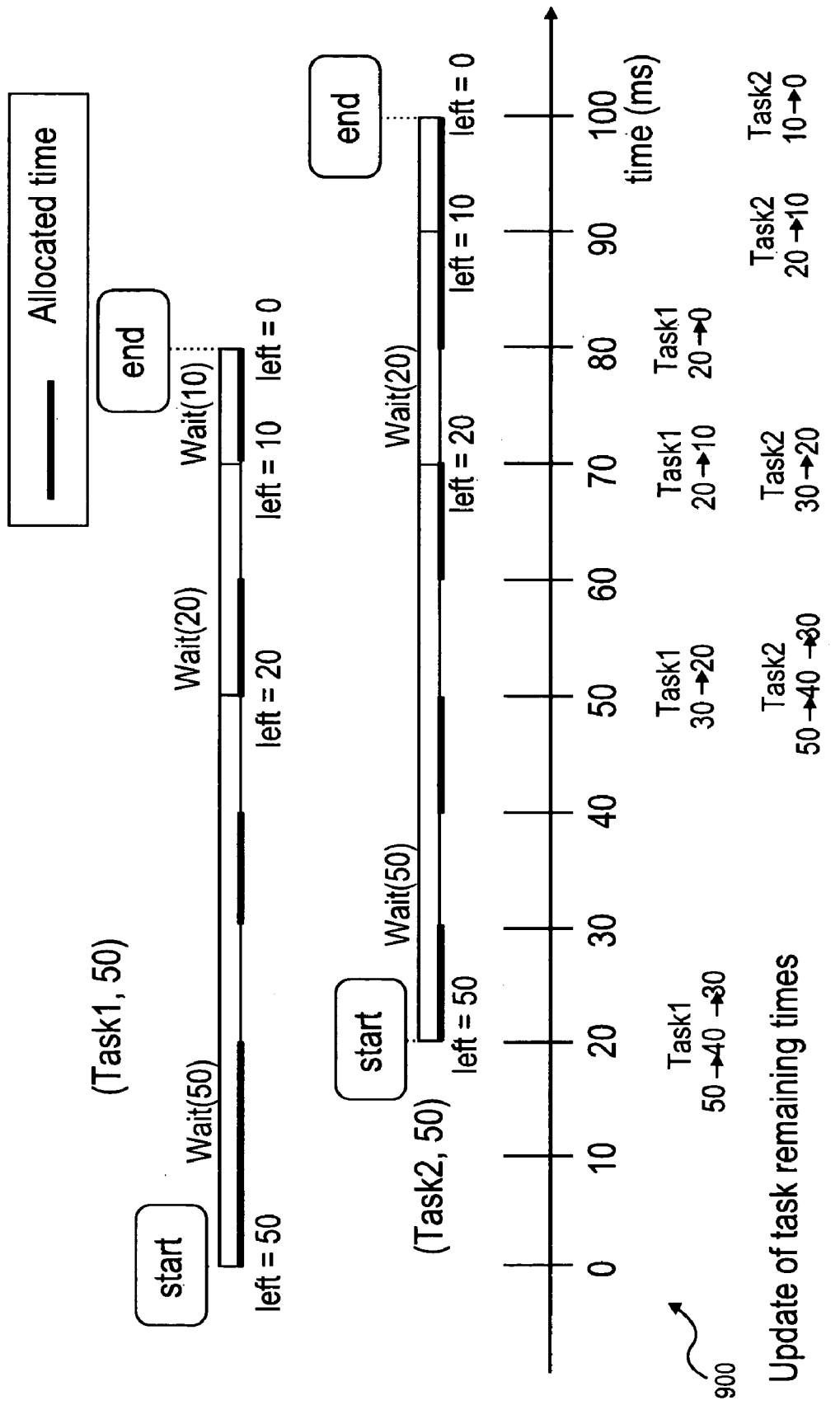

SYSTEM SIMULATION USING MULTI-TASKING COMPUTER CODE

FIELD OF THE INVENTION

The present invention relates generally to simulating systems, such as hardware or software systems, and more particularly to simulating such systems by using multi-tasking computer code.

BACKGROUND OF THE INVENTION

During the design of a system, such as a hardware or a software system, simulation is a tool that allows a developer to determine whether the subsequently developed system is likely to operate correctly, even before its constituent modules have been completely developed. If it is possible to perform simulation during an early design phase of a project, it may be possible to verify whether or not all the requirements of execution of the project will likely be satisfied even before the system has been developed. As a result, there are likely to be fewer design changes to the system once it has been implemented.

One type of simulation model that is utilized within the prior art is referred to as a timed-functional model. In this model, the individual sections or modules of a system do not have to be completely developed. Instead, the timed-functional model focuses on the time it takes to process these individual modules, and on communication with the other modules of the system, to evaluate throughput, resource utilization rates, and so on. The time it takes to process each module is determined by hardware or software, using appropriately mapped functions. Simulation code of this type may be written by a developer, or it may be generated by converting the design of a system using a diagram coded in a modeling language like the Universal Modeling Language (UML). Such simulation models can be realized within simulation systems including SystemC, available on the Internet at www.systemc.org, SpecC, described on the Internet at www.specc.gr.jp/eng/index.htm, and SimJava, available on the Internet at www.dcs.ed.ac.uk/home/hase/simjava/.

When a timed-functional model of a system having a number of models is actually mapped into software, the system can be mapped to multi-tasking software. However, existing simulation systems assume that modules of a system to be simulated are to be executed in parallel with one another. However, where such modules cannot be executed at the same time in actuality, such simulation will not accurately reflect the operation of the system once it is constructed. Other types of existing simulation systems allow for the modules of a system to be simulated to be executed in a non-parallel manner with respect to one another, but they always force a lower-priority task to halt processing when a higher-priority task is to be executed, which means that preemptive scheduling cannot be provided for in such systems.

For these and other reasons, therefore, there is a need for the present invention.

SUMMARY OF THE INVENTION

The present invention relates to simulating a system using multi-tasking computer code. The system may be a hardware or a software system, and has a number of modules, which in the case of software may be the individual processes of a computer program. A method of the invention includes simulation computer code launching a number of tasks simulating execution of the system having the number of modules, where each task corresponds to one of the modules. Each task requests a processing delay to a common scheduler. Upon the common scheduler receiving a processing delay request from a task, the following is performed. The common scheduler instructs a scheduling method processor to update a task-remaining time for at least one of the tasks. The scheduling method processor updates the task-remaining time for at least one of the tasks based at least on a scheduling approach. The common scheduler sends a wait request to a preexisting simulation system to delay a module within the system that corresponds to the task by a length of time, based on the task-remaining time for the task and the scheduling approach. The preexisting simulation system further delays the module within the system that corresponds to the task by the length of time specified within the wait request.

A computerized system of the invention includes simulation computer code, and scheduler computer code. The simulation computer code launches a number of tasks simulating execution of a system having a number of modules. Each task corresponds to a module. The scheduler computer code is to receive processing delay requests from the tasks. The scheduler computer code is also to update task-remaining times for the tasks based at least on a scheduling approach. The scheduler computer code is further to send wait requests based on the task-remaining times for the tasks and the scheduling approach. A preexisting simulation system then delays the modules that correspond to the tasks in response to the wait requests.

An article of manufacture of the invention includes a tangible computer-readable medium and means in the medium. The tangible computer-readable medium may be a recordable data storage medium, or another type of tangible computer-readable medium. The means is for receiving processing delay requests from tasks simulating execution of a system that has a number of modules to which the tasks correspond. The means is further for updating task-remaining times for the tasks based at least on a scheduling approach. The means is also for sending wait requests to a preexisting simulation system to delay the modules that correspond to the tasks based on the task-remaining times for the tasks and the scheduling approach.

Embodiments of the invention provide for advantages over the prior art. The invention provides for simulation of a system within a design model phase, where each task is written as simulation code of a timed functional mode, and execution is managed such that these tasks are scheduled and then executed. Embodiments of the invention desirably do not change preexisting simulation systems that can be used to actually simulate a system being designed. Furthermore, embodiments of the invention provide for preemption, so that a higher-priority task does not operate to the detriment of a lower-priority task. Embodiments of the invention allow for changeable or addable scheduling approaches, such as preemptive priority scheduling and round-robin scheduling. Embodiments of the invention also allow the amount of a time a given task corresponding to a given module is delayed to be modified or changed, at time of execution.

Still other advantages, aspects, and embodiments of the invention will become apparent by reading the detailed description that follows, and by referring to the accompanying drawings.

DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 7 is a trace diagram that illustratively depicts repeated performance of the method of FIG. 6 in relation to an example system, according to an embodiment of the invention.

FIG. 9 is a trace diagram that illustratively depicts repeated performance of the method of FIGS. 8A, 8B, and 8C in relation to an example system, according to an embodiment of the invention.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
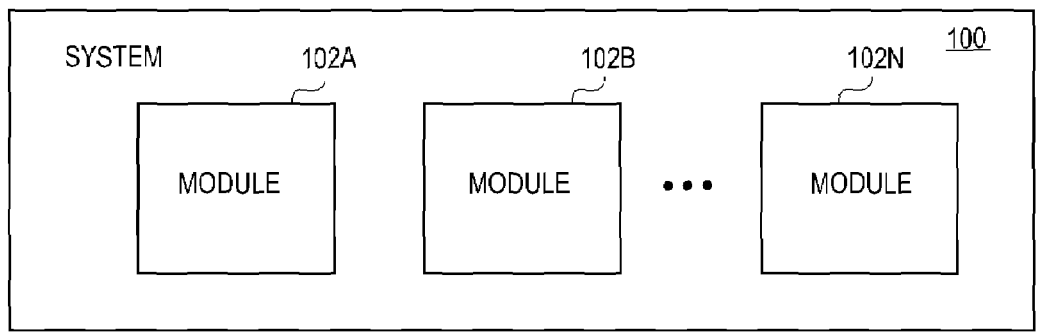
FIG. 1 is a block diagram of a rudimentary system that can be simulated in accordance with embodiments of the invention.

FIG. 1 shows a rudimentary system 100 that can be simulated in accordance with embodiments of the invention. The system 100 may be a hardware system, a software system, or a system having a combination of both hardware and software. The system 100 has a number of constituent modules 102A, 102B, . . . , 102N, collectively referred to as the modules 102. Each of the modules 102 performs a given functionality, and may be able to communicate with other of the modules 102. As a whole, then, the modules 102 implement the system 100. The modules 102 may each be a hardware module, such as a sensor or a printer, a software module, such as a section of computer code, or a module having a combination of hardware and software.

Figure 2:
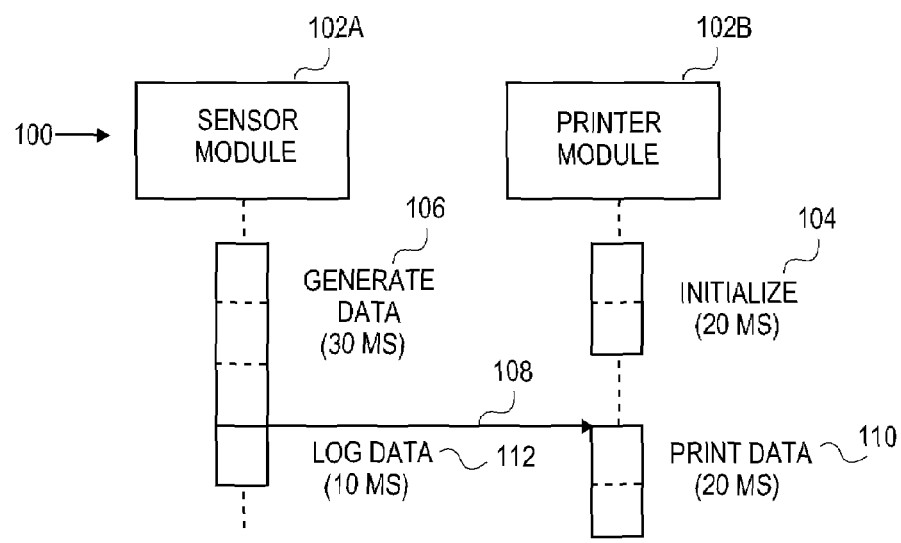
FIG. 2 is a diagram of a particular example of a rudimentary system that can be simulated in accordance with embodiments of the invention.

FIG. 2 shows a particular example of the rudimentary system 100, as a concrete yet simple example of a type of system that can be simulated in accordance with embodiments of the invention. The system 100 includes two particular modules: a sensor module 102A, and a printer module 102B. The printer module 102B takes twenty milliseconds to initialize, as indicated by the reference number 104. At the same time, the sensor module 102A generates (i.e., senses) data in thirty milliseconds, as indicated by the reference number 106. Once the generation of the data is finished, the data is communicated to the printer module 102B, which then prints the data in a twenty-millisecond process, as indicated by the reference number 110. Before it receives the data, the printer module 102B is thus idle for ten milliseconds. Simultaneous to the printing of the data, the sensor module 102A may log the data, which is a ten-millisecond process indicated by the reference number 112.

Figure 3:
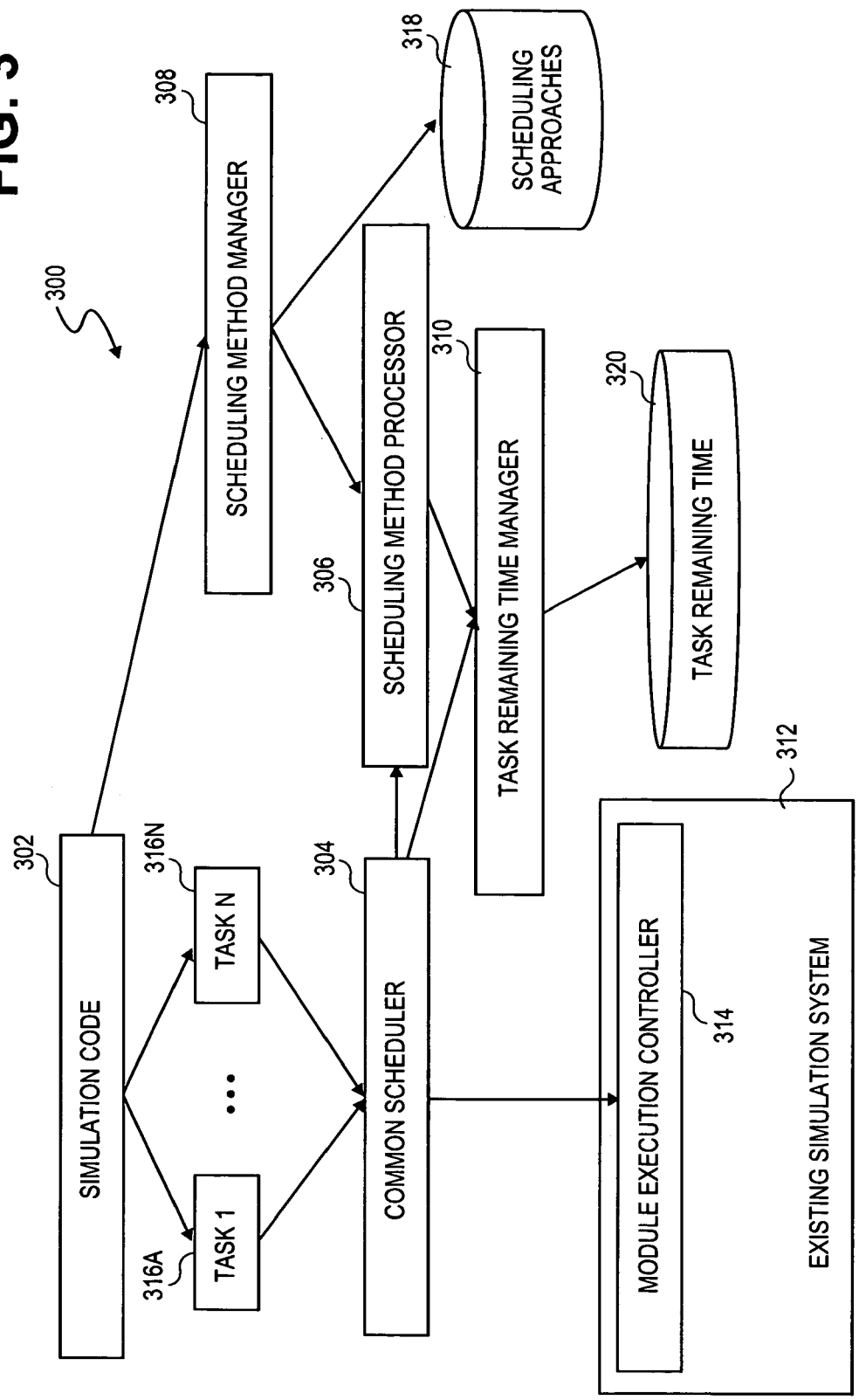
FIG. 3 is a diagram of a system that is able to simulate systems, such as the systems of FIGS. 1 and 2, by using a preexisting simulation system without modification, according to an embodiment of the invention, and is suggested for printing on the first page of the patent.

FIG. 3 shows a system 300 that can be used to simulate systems, such as the system 100 of FIGS. 1 and/or 2, by using a preexisting simulation system 312, without modifying the system 312, according to an embodiment of the invention. The system 300 includes simulation computer code 302, a common scheduler 304, a scheduling method processor 306, a scheduling method manager 308, and a task remaining-time manager 310, each of which can be implemented in software, hardware, or a combination of software and hardware. The common scheduler 304 and the scheduling method processor 306 may in unison be referred to as scheduler computer code. A portion of the functionality of each of the components of the system 300 is now briefly described, and then the process by which the system 300 simulates a system is described in relation to a number of methods, which will further provide information on the functionality of each of the components of the system 300.

The simulation computer code 302 launches a number of tasks 316A, . . . , 316N, collectively referred to as the tasks 316, and which correspond to the modules 102 of the system 100 being simulated. The common scheduler 304 is to receive processing delay requests from the tasks 316. The scheduling method processor 306 is to update task-remaining times for the tasks 316 in response to instruction from the common scheduler, where these task-remaining times are stored in a task-remaining time database 320.

The scheduling method manager 308 is to select a given scheduling approach requested by the simulation computer code 302, as one of the scheduling approaches stored in the database 318, and having a corresponding scheduling method processor 306. The common scheduler sends wait requests to the preexisting simulation system 312 to delay modules 102 within the system 100 that correspond to the tasks 316, by lengths of time based on the task-remaining times for the tasks 316, and the selected scheduling approach. The task-remaining time manager 310 manages the remaining time for each of the tasks 316. The module execution controller 314 is the portion of the preexisting simulation system 312 in one embodiment that actually delays the modules 102.

Figure 4:
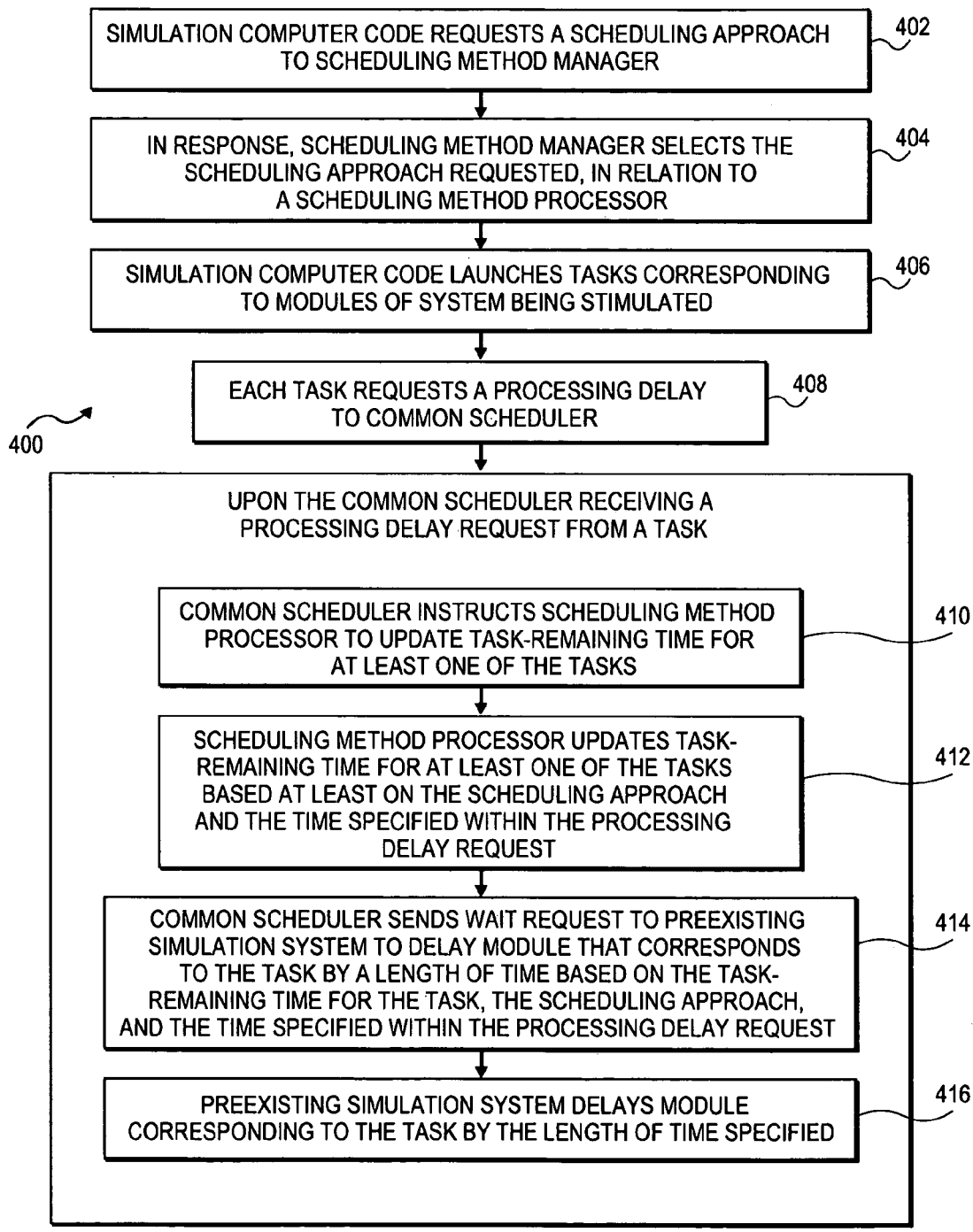
FIG. 4 is a flowchart of a method for using the system of FIG. 3 to simulate a system, such as the systems of FIGS. 1 and 2, by using a preexisting simulation system, according to an embodiment of the invention.

FIG. 4 shows a method 400 for using the system 300 to simulate a system, such as the system 100 of FIGS. 1 and 2, using the preexisting simulation system 312, according to an embodiment of the invention. First, the simulation computer code 302 requests a scheduling approach from the scheduling method manager 308 (402). A scheduling approach is the approach, or method, that will be followed to schedule execution of tasks to be performed, in a multi-tasking manner. For example, one scheduling approach is preemptive priority scheduling. In preemptive priority scheduling, a higher-priority task generally is executed over a lower-priority task, but at times the execution of the higher-priority task is preempted so that the lower-priority task can partially execute, so that the lower-priority task is not completely starved of execution time. As another example, one scheduling approach is round-robin scheduling. In round-robin scheduling, each task is given a period of time in which to execute, in a round-robin manner, until the tasks are finished executing. The request in part 402 of the method 400 may include the name of the scheduling approach desired, as well as the conditions that the scheduling approach may need to satisfy, for instance.

In response, the scheduling method manager 308 selects the scheduling approach requested from the scheduling approaches database 318, and in so doing selects the scheduling method processor 306 that corresponds to this scheduling approach (404). That is, the scheduling method manager 308 looks up the scheduling approach within the database 318. The database 318 contains identities of a number of scheduling method processors that effectuate or implement these scheduling approaches. Thus, looking up the scheduling approach requested within the database 318 provides the identity of the scheduling method processor 306 that corresponds to the scheduling approach requested by the simulation computer code 302.

The simulation computer code 302 then initiates or launches the tasks 316 (406). The tasks 316 correspond to the modules 102 of the system 100 being simulated by performance of the method 400. A task can be considered a thread to be provided within a programming language, or a structure to be provided by the existing simulation system 312, in different embodiments of the invention. In accordance with the progress of processing of each task, the task requests a processing delay to the common scheduler 304 (408). That is, the task generates a processing delay request and sends it to the common scheduler 304, to correspond to the task executing the functionality of a corresponding module. It is noted that the processing delay request does not actually implement or execute this functionality, but rather simply represents the time that it would take to implement or execute this functionality. In this respect, simulation as is performed by embodiments of the invention is a timed-functional simulation model.

Upon the common scheduler 304 receiving a processing delay request from a task, the following is performed. The common scheduler 304 instructs the scheduling method processor 306 to update the task-remaining time for at least one of the tasks (410), which may or may not include the task from which the common scheduler 304 most immediately received a processing delay request. The scheduling method processor 306 then updates the task-remaining time for one or more of the tasks (412), such as through the task-remaining time manager 310 updating the task-remaining times as appropriate within the database 320. The updating of the task-remaining time is based at least on the scheduling approach that governs the simulation, as well as a time specified within the processing delay request.

For example, a task may indicate that it needs 100 milliseconds to process, such that the processing delay request therefrom specifies this 100-millisecond time. The task-remaining time is decremented as a task progresses, where a task receives execution time in accordance with the scheduling approach selected. For instance, in a round-robin approach where one task is competing with three other tasks for execution time, in any given 40-millisecond period, the task in question may receive 10 milliseconds of processing or execution time. Therefore, it can take up to ten of these 40-millisecond periods in order for a task needing 100 milliseconds to completely process.

The common scheduler 304 further sends a wait request to the preexisting simulation system 312 to delay the module that corresponds to the task from which the common scheduler 304 most immediately received a processing delay request (414). This wait request is based on the task-remaining time for the task, the scheduling approach governing the simulation, and the time specified within the processing delay request itself. This request is sent in one embodiment to a module execution controller 314 of the preexisting simulation system 312, where the controller 314 is that which controls the execution of the modules of the system 100 being simulated. It is noted that the wait request thus includes the task-remaining time for the task as an argument. The preexisting simulation system therefore in response delays the module in question by the length of time specified in the wait request (416).

The system 300 thereafter operates by progressing a simulation time, in which each module is delayed in accordance with the wait requests received by the preexisting simulation system 312. The preexisting simulation system 312 interacts with the system 300 to provide specific feedback as to the exact simulation of the modules 102 of the system 100. By comparison, the purpose of the system 300 is to build an architecture around the system 312, so that the system 300 can be employed in conjunction with a desired scheduling approach. Thus, the tasks 316 that are launched, the task-remaining time that are stored in the database 320, and so on, all serve the purpose of ensuring that a preexisting simulation system 312 can be used for any desired scheduling approach. Part of this is enabled by virtue of the wait requests being sent to the preexisting simulation system 312 (i.e., via the module execution controller 314 thereof) having arguments that are dynamic in nature. That is, the preexisting simulation system 312 is provided with wait requests for different times, as described in relation to part 414 of the method 400.

Figure 5:
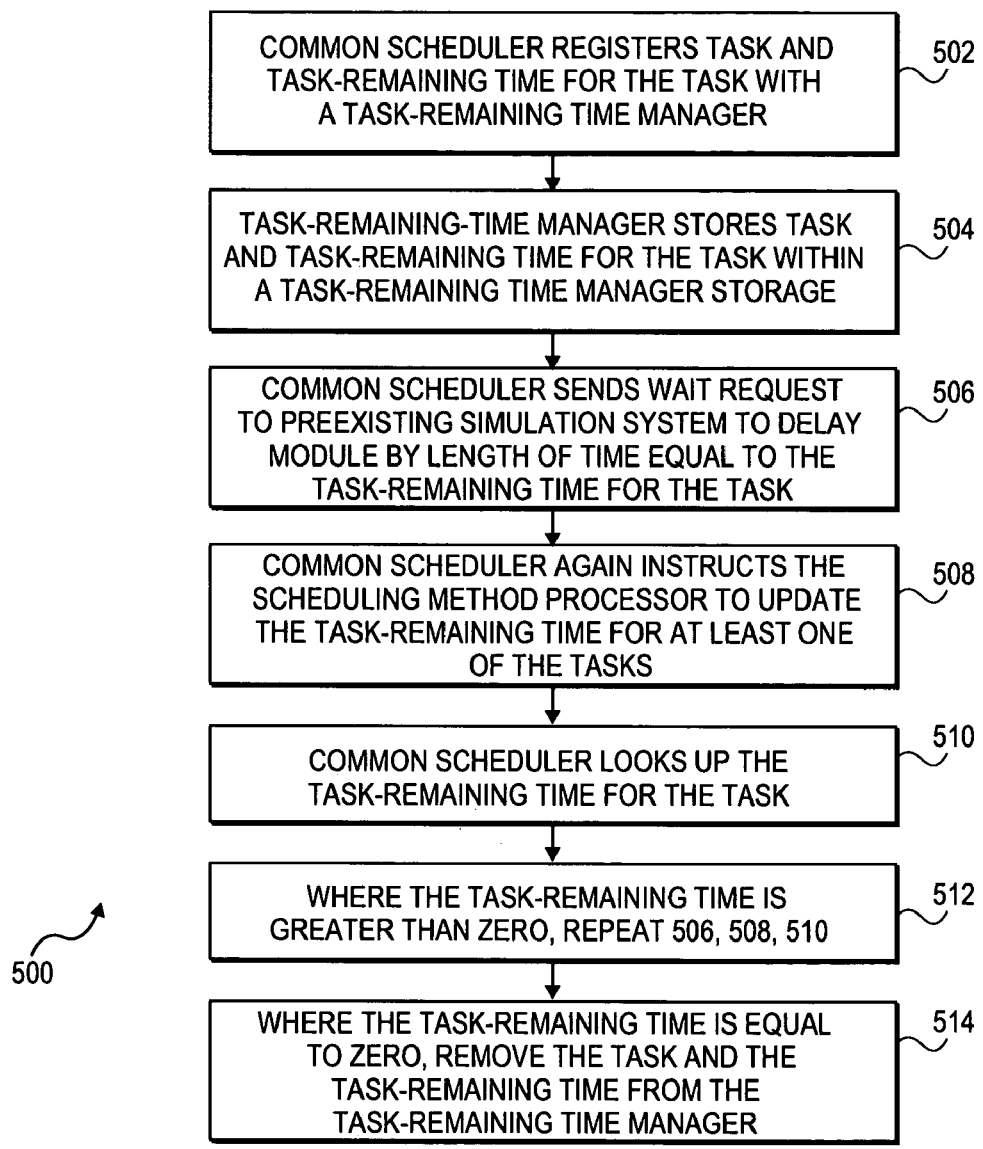
FIG. 5 is a flowchart of a method that explicates parts of the method of FIG. 4, according to an embodiment of the invention.

FIG. 5 shows a method 500 that is performed after the initial performance of the method 400 of FIG. 4, or that is performed in conjunction with the method 400 of FIG. 4, according to an embodiment of the invention. That is, the method 500 shows the process of the method 400 that is performed in conjunction with parts 410, 412, 414, and 416 of the method 400. More specifically, when a task requests a processing delay to the common scheduler 304 in part 408 of the method 400, the method 500 can be performed in addition to and/or in lieu of parts 410, 412, 414, and 416 of the method 400. The method 500 can thus be considered an explicated version of parts 410, 412, 414, and 416, in which these parts are described in more detail.

First, the common scheduler 304 registers a task and the task-remaining time for the task with the task remaining-time manager 310 (502). In response, the task remaining-time manager 310 stores the task and the task-remaining time for the task within a task remaining-time manager storage (504), such as the database 320. The common scheduler 304 then sends a wait request to the preexisting simulation system 312 to delay the module to which the task corresponds by a length of time equal to the task-remaining time for the task (506). The common scheduler 304 again instructs the scheduling method processor 306 to update the task-remaining time for at least one of the tasks (508), as has been described.

Thus, as the task-remaining time decreases for the tasks, the common scheduler 304 looks up the tasking-remaining time for the task (510), via the task remaining-time manager 310 and the database 320. Where the task-remaining time is greater than zero, parts 506, 508, and 510 are repeated (512). Otherwise, once the task-remaining time reaches zero, the task and the task-remaining time are removed from the task remaining-time manager 310 (514). That is, the task remaining-time manager 310 removes the task and the task-remaining time of zero from the database 320. In this way, the progression of tasks is recorded in the task-remaining times of the database 320, such that just the tasks that have such times greater than zero remain in the database 320.

Figure 6:
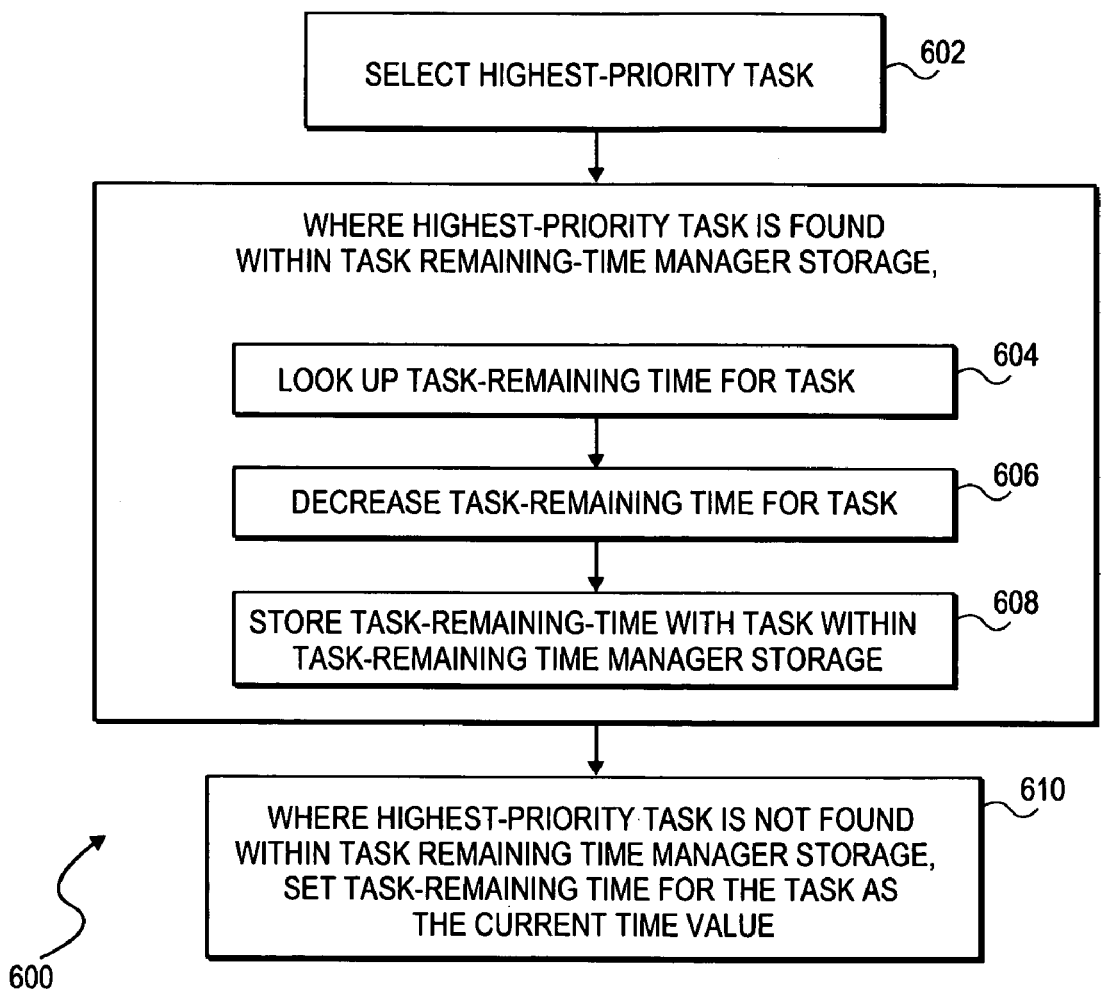
FIG. 6 is a flowchart of a method for updating task-remaining times for tasks in accordance with a preemptive priority scheduling approach, according to an embodiment of the invention.

As has been described, in one embodiment of the invention, the scheduling approach is preemptive priority scheduling. FIG. 6 shows a method 600 that can be performed to update the task-remaining time for at least one of the tasks where the scheduling approach is preemptive priority scheduling, according to an embodiment of the invention. Thus, the method 600 can be performed within part 410 of the method 400 of FIG. 4, and/or part 508 of the method 500 of FIG. 5.

First, the highest-priority task of all the tasks is selected (602). If the highest-priority task is found within the task remaining-time manager storage—that is, within the database 320—then the following is performed. The task-remaining time for this task is looked up (604), and decreased (606). For instance, a value equal to the current time minus the time when the scheduling method processor last updated the task-remaining time for at least one of the tasks is subtracted from the task-remaining time. That is, a value equal to the current time minus the time when the method 600 was last performed is subtracted from the task-remaining time. The task-remaining time as has been updated (i.e., decreased) is then stored with the task within the task remaining-time manager storage (608). Otherwise, if the highest-priority task is not found within the task remaining-time manager storage (610), then the task-remaining time for this task is set and stored within the task remaining-time manager storage equal to the current time value.

FIG. 7 shows a trace diagram that illustrates the repeated performance of the method 600 for an example system, according to an embodiment of the invention. The system in question has two modules that have corresponding tasks: a low-priority task and a high-priority task. In this example, task1 is denoted as the low-priority task that invokes a delay request for 50 milliseconds, and after 20 milliseconds has transpired, task2, denoted as the high-priority task, invokes a delay request also for 50 milliseconds.

Thus, at 0 milliseconds, although the method 600 is invoked, the task remaining-time database 320 is empty, such that 50 milliseconds is registered as the task-remaining time for task1. Task1 is expected to move out of the waiting process after 50 milliseconds have elapsed.

However, at 20 milliseconds, the method 600 is invoked as to task2. The executable task between 0 milliseconds and 20 milliseconds is just task1, and since 20 milliseconds have elapsed, the 50 milliseconds registered as the task-remaining time for task1 is replaced with 30 milliseconds. 50 milliseconds are then registered as the task-remaining time for task2. Task2 is expected to move out of the waiting process after 50 milliseconds have elapsed.

At 50 milliseconds, the method 600 is invoked as to task1. Because task2 has a higher priority, and because 30 milliseconds have elapsed, the 50 milliseconds registered as the task-remaining time for task2 is replaced with 20 milliseconds. Since the remaining time of task1 stays at 30 milliseconds, task1 waits for 30 milliseconds, such that task1 is expected to proceed after 30 milliseconds have elapsed at 80 milliseconds.

At 70 milliseconds, the method 600 is again invoked as to task2. Task2 is again the higher-priority task, and because 20 milliseconds have elapsed, the task-remaining time for task2 is now 0 milliseconds. Task2 has ended, and it is removed from the database 320.

Next, at 80 milliseconds, the method 600 is again invoked as to task1. The only executable task between 70 and 80 milliseconds is task1, and 10 milliseconds have elapsed. Therefore, the 30 milliseconds registered as the task-remaining time for task1 is replaced with 20 milliseconds. Task1 waits for 20 milliseconds, and it is expected to end at 100 milliseconds.

Thus, at 100 milliseconds, the method 600 is again invoked as to task1. The only executable task between 80 and 100 milliseconds is task1, and 20 milliseconds have elapsed. Therefore, the task-remaining time for task1 is now 0 milliseconds, such that task1 has ended, and it is removed from the database 320.

The example of FIG. 7 is illustrative in comparison with the prior art. In the prior art, task2 would be kept waiting until task1 is finished at 50 milliseconds. However, in the invention, task2 is processed immediately. That is, a high-priority task is not blocked by a low-priority task, and preemptive priority scheduling is properly achieved.

Figure 8A:
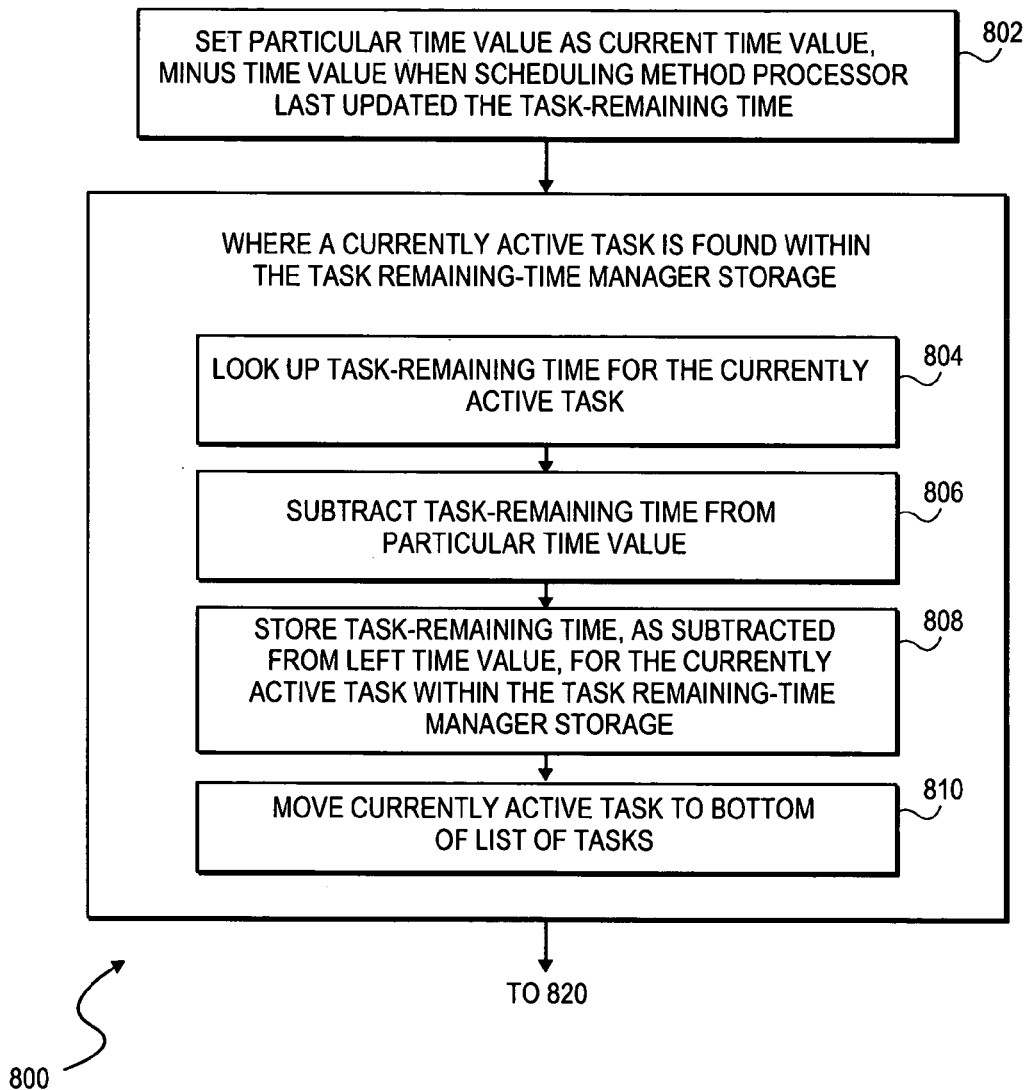
FIGS. 8A, 8B, and 8C are flowcharts of a method for updating task-remaining times for tasks in accordance with a round-robin scheduling approach, according to an embodiment of the invention.
Figure 8B:
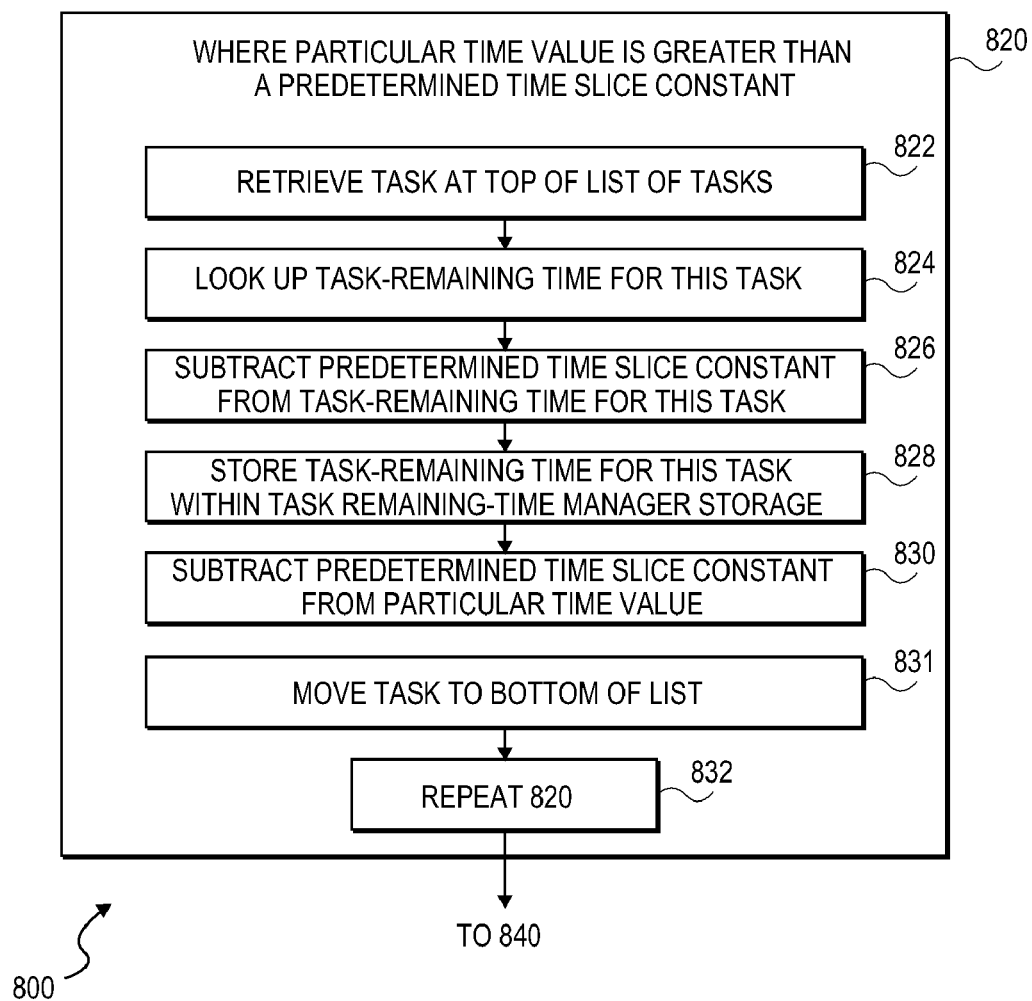
Figure 8C:
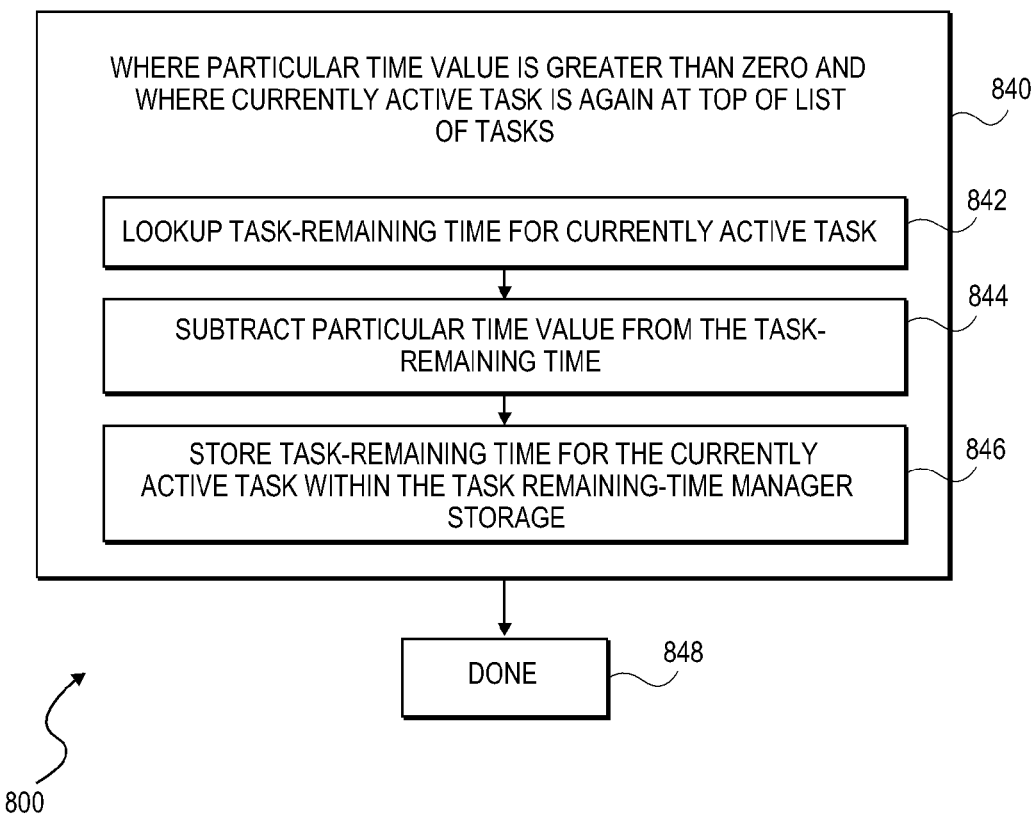

As has been described, in another embodiment of the invention, the scheduling approach is round-robin scheduling. FIGS. 8A, 8B, and 8C show a method 800 that can be performed to update the task-remaining time for at least one of the tasks where the scheduling approach is round-robin scheduling, according to an embodiment of the invention. Thus, the method 800 can be performed within part 410 of the method 400 of FIG. 4, and/or part 508 of the method 500 of FIG. 5. Referring first to FIG. 8A, what is referred to as a particular time value is set as the current time value, minus the time value when the scheduling method processor 306 last updated the task-remaining time for a task (802).

Where a currently active task is found within the task remaining-time manager database 320—that is, where the task that is currently being executed is found within the database 320—the following is performed. The task-remaining time for this task is looked up within the database 320 (804). The particular time value has subtracted therefrom this task-remaining time (806). Next, another time value, which is particular to this task and is referred to as "left" has subtracted from it the task-remaining time for this task, and this quantity of "left" minus the task-remaining time is stored as the task-remaining time for the currently active task in the database 320 (808). It is noted that the time value "left" is the duration of time a particular task will completely consume in order to be completely executed. That is, the "left" time value is the original or initial task-remaining time for a given task, before it has been executed at all. Finally, the currently active task is moved to the bottom of a list of all the tasks (810).

Referring next to FIG. 8B, where the particular time value that has been determined is greater than a predetermined time slice constant (820), the following is performed. The predetermined time slice constant is the time unit by which execution of the tasks can proceed. For example, this constant may be 10 milliseconds, where the smallest amount of time any of the tasks can proceed with execution is by 10 milliseconds.

Therefore, first, the task at the top of the list of all the tasks is retrieved (822). The task-remaining time for this task is looked up in the database 320 (824). The predetermined time slice constant is subtracted from the task-remaining time for this task. (826), and the task-remaining time as has been updated is stored within the database 320 (828). The predetermined time slice constant is then subtracted from the particular time value that has been determined (830). Finally, this task is moved to the bottom of the list of all the tasks (831). The method 800 then repeats at 820 (832), such that, for instance, parts 822, 824, 826, 828, 830, 831, and 832 are repeated until the particular time value is no longer greater than the predetermined time slice constant.

Referring finally to FIG. 8C, where the particular time value is greater than zero, and where the currently active task is again at the top of the list of all the tasks (840), the following is performed. First, the task-remaining time for the currently active task is looked up within the database 320 (842). The particular time value is subtracted from the task-remaining time (844), and the task-remaining time is then stored again for the currently active task, as this time has been updated, within the database 320 (846). The method 800 is then finished (848).

FIG. 9 shows a trace diagram that illustrates the repeated performance of the method 800 for an example system, according to an embodiment of the invention. The system in question has two modules that have corresponding tasks, a first task referred to as task1, and a second task referred to as task2. At 0 milliseconds, although the method 800 is invoked, the task-remaining time database 320 is empty, such that 50 milliseconds is registered as the task-remaining time for task1. Task1 is expected to move out of the waiting process after 50 milliseconds have elapsed.

However, at 20 milliseconds, the method 800 is invoked as to task2. The executable task between 0 milliseconds and 20 milliseconds is just task1, and since 20 milliseconds have elapsed, the 50 milliseconds is replaced first with 40 milliseconds and then with 30 milliseconds, via the part of the method 800 within FIG. 8B. 50 milliseconds are then registered as the task-remaining time for task2. Task1 is expected to move out of the waiting process after 30 milliseconds have elapsed, and task2 is expected to move out of the waiting process after 50 milliseconds have elapsed.

At 50 milliseconds, the method 800 is invoked as to task1. The executable tasks between 20 milliseconds and 50 milliseconds include both task1 and task2. The 50 milliseconds for task2 is replaced with 40 milliseconds, the 30 milliseconds for task1 is replaced with 20 milliseconds, and then the 40 milliseconds for task2 is replaced with 30 milliseconds. Task1 is expected to move out of the waiting process after 20 milliseconds have elapsed, and task2 is expected to move out of the waiting process after 30 milliseconds have elapsed.

At 70 milliseconds, the method 800 is invoked first as to task2. The executable tasks between 50 and 70 milliseconds include both task1 and task2. The 20 milliseconds associated with task1 is replaced with 10 milliseconds, and the time remaining of 30 milliseconds for task2 is replaced with 20 milliseconds. Task2 is expected to move out of the waiting process after 20 milliseconds have elapsed.

The method 800 is then invoked as to task1, still at 70 milliseconds, but because no time has elapsed, nothing is accomplished. Task1 is expected to move out of the waiting process after 10 milliseconds have elapsed.

At 80 milliseconds, the method 800 is invoked as to task1. The executable tasks between 70 and 80 milliseconds include both task1 and task2. Since 10 milliseconds have elapsed, the 10 milliseconds associated with task1 is replaced with 0 milliseconds, such that the remaining time for task1 becomes 0 milliseconds, and such that task1 ends.

At 90 milliseconds, the method 800 is invoked as to task2. The executable task between 80 and 90 milliseconds is just task2, and since 10 milliseconds have elapsed, the 20 milliseconds for task2 (i.e., the task-remaining time for task2) is replaced with 10 milliseconds. Task2 is expected to move out of the waiting process after 10 milliseconds have elapsed.

Therefore, at 100 milliseconds, the method 800 is invoked as to task2. The executable task between 90 and 100 milliseconds is just task2, and since 10 milliseconds have elapsed, the 10 milliseconds associated with task2 is replaced with 0 milliseconds, such that the remaining time for task2 becomes 0 milliseconds, and such that task2 ends.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such, it is manifestly intended that this invention be limited only by the claims and equivalents thereof.

We claim:

1. A method to perform timed-functional simulation of a given system having a plurality of modules, using a preexisting simulation system, comprising:

starting the preexisting simulation system;

launching a plurality of tasks simulating execution of the given system, each task corresponding to one of the modules of the given system, the tasks simulating the execution of the given system using the preexisting simulation system;

each task generating a processing delay request to a common scheduler;

upon the common scheduler receiving the processing delay request from a given task, performing the following steps:

the common scheduler instructing a scheduling method processor to update a task-remaining time for at least one of the tasks other than the given task;

the scheduling method processor updating the task-remaining time for the at least one of the tasks other than the given task based at least on a scheduling approach;

the common scheduler sending a wait request to the preexisting simulation system to delay a module within the given system that corresponds to the given task by a length of time based on the task-remaining time for the given task and the scheduling approach; and, the preexisting simulation system delaying the module within the given system that corresponds to the given task by the length of time specified within the wait request, and thereafter simulating the module within the given system that corresponds to the given task, wherein the scheduling approach is round-robin scheduling, and the scheduling method processor updating the task-remaining time for the at least one of the tasks other than the given task comprises:

setting a particular time value as a current time value minus a time value when the scheduling method processor last updated the task-remaining time for the at least one of the tasks other than the given task;

where a currently active task is found within a task-remaining time manager storage, looking up the task-remaining time for the currently active task within the task-remaining time manager storage;

subtracting the task-remaining time for the currently activate task from the particular time value;

subtracting the task-remaining time for the currently active task from a left time value for the currently active task and storing as the task-remaining time for the currently active task, within the task-remaining time manager storage;

moving the currently active task to a bottom of a list of the tasks;

where the particular time value is greater than a predetermined time slice constant, retrieving a select task at a top of the list of the tasks;

looking up the task-remaining time for the select task at the top of the list of the tasks;

subtracting the predetermined time slice constant from the task-remaining time for the select task at the top of the list of the tasks;

storing the task-remaining time for the select task at the top of the list of the tasks, as from which the predetermined time slice constant has been subtracted, within the task-remaining time manager storage;

subtracting the predetermined time slice constant from the particular time value; and, moving the select task to the bottom of the list of the tasks.

2. The method of claim 1, further comprising initially, in response to a request from the simulation computer code for a scheduling approach, a scheduling method manager selecting the scheduling approach requested in relation to the scheduling method processor.

3. The method of claim 2, further comprising initially the simulation computer code requesting the scheduling approach to the scheduling method manager.

4. The method of claim 1, further comprising each task generating the processing delay request to the common scheduler, as processing of each task progresses.

5. The method of claim 1, wherein the common scheduler instructs the scheduling method processor to update the task-remaining time for the at least one of the tasks other than the given task also based on a time specified within the processing delay request.

6. The method of claim 5, wherein the scheduling method processor updates the task-remaining time for the at least one of the tasks other than the given task also based on the time specified within the processing delay request.

7. The method of claim 1, further comprising the common scheduler registering the given task and the task-remaining time for the given task with a task-remaining time manager.

8. The method of claim 7, further comprising the task-remaining time manager storing the given task and task-remaining time for the given task within a task-remaining time manager storage in response to registration.

9. The method of claim 7, wherein the common scheduler sending the wait request to the preexisting simulation system to delay the module by the length of time based on the task-remaining time for the given task comprises the common scheduler sending the wait request to the preexisting simulation system to delay the module by the length of time as equal to the task-remaining time for the given task.

10. The method of claim 9, further comprising:

the common scheduler again instructing the scheduling method processor to update the task-remaining time for the at least one of the tasks other than the given task;

the common scheduler looking up the task-remaining time for the given task;

where the task-remaining time for the given task is greater than zero, repeating sending the wait request to the preexisting simulation system, again instructing the scheduling method processor to update the task-remaining time for the at least one of the tasks other than the given task, and looking up the task-remaining time for the given task; and, where the task-remaining time for the given task is equal to zero, removing the given task and the task-remaining time for the given task from the task-remaining time manager.

11. The method of claim 1, wherein the scheduling approach is round-robin scheduling, and the scheduling method processor updating the task-remaining time for the at least one of the tasks other than the given task further comprises:

where the particular time value is greater than zero,
where the currently active task is now at the top of the list of the tasks,
looking up the task-remaining time for the currently active task within the task-remaining time manager storage;
subtracting the particular time value from the task-remaining time for the currently active task; and,
storing the task-remaining time for the currently active task, as from which the particular time value has been subtracted, within the task-remaining time manager storage.

12. A computerized system to perform timed-functional simulation of a given system having a plurality of modules, using a preexisting simulation system, comprising:

hardware;

a simulation module implemented at least by the hardware; and, a scheduler module implemented at least by the hardware, wherein the simulation module and the scheduler module are to:

start the preexisting simulation system;

launch a plurality of tasks simulating execution of the given system, each task corresponding to one of the modules of the given system, the tasks simulating the execution of the given system using the preexisting simulation system, where each task generates a processing delay request;

upon receiving the processing delay request from a given task, perform the following steps;

instruct a scheduling method processor to update a task-remaining time for at least one of the tasks other than the given task so that the scheduling method processor updates the task-remaining time for the at least one of the tasks other than the given task based at least on a scheduling approach;

send a wait request to the preexisting simulation system to delay a module within the given system that corresponds to the given task by a length of time based on the task-remaining time for the given task and the scheduling approach, where the preexisting simulation system delays the module within the given system that corresponds to the given task by the length of time specified within the wait request, and thereafter simulates the module within the given system that corresponds to the given task, wherein the scheduling approach is round-robin scheduling, and the scheduling method processor updates the task-remaining time for the at least one of the tasks other than the given task by:

setting a particular time value as a current time value minus a time value when the scheduling method processor last updated the task-remaining time for the at least one of the tasks other than the given task;

where a currently active task is found within a task-remaining time manager storage,
looking up the task-remaining time for the currently active task within the task-remaining time manager storage;
subtracting the task-remaining time for the currently activate task from the particular time value;
subtracting the task-remaining time for the currently active task from a left time value for the currently active task and storing as the task-remaining time for the currently active task within the task-remaining time manager storage;

moving the currently active task to a bottom of a list of the tasks;

where the particular time value is greater than a predetermined time slice constant, retrieving a select task at a top of the list of the tasks;

looking up the task-remaining time for the select task at the top of the list of the tasks;

subtracting the predetermined time slice constant from the task-remaining time for the select task at the top of the list of the tasks;

storing the task-remaining time for the select task at the top of the list of the tasks, as from which the predetermined time slice constant has been subtracted, within the task-remaining time manager storage;

subtracting the predetermined time slice constant from the particular time value; and, moving the select task to the bottom of the list of the tasks.

13. An article of manufacture comprising:

a tangible computer-readable medium storing instructions for performing timed-functional simulation of a given system having a plurality of modules, using a preexisting simulation system, by:

starting the preexisting simulation system;

launching a plurality of tasks simulating execution of the given system, each task corresponding to one of the modules of the given system, the tasks simulating the execution of the given system using the preexisting simulation system, where each task generates a processing delay request;

upon receiving the processing delay request from a given task, perform the following steps:

instructing a scheduling method processor to update a task-remaining time for at least one of the tasks other than the given task so that the scheduling method processor updates the task-remaining time for the at least one of the tasks other than the given task based at least on a scheduling approach;

sending a wait request to the preexisting simulation system to delay a module within the given system that corresponds to the given task by a length of time based on the task-remaining time for the given task and the scheduling approach, where the preexisting simulation system delays the module within the given system that corresponds to the given task by the length of time specified within the wait request, and thereafter simulates the module within the given system that corresponds to the given task, wherein the scheduling approach is round-robin scheduling, and the scheduling method processor updates the task-remaining time for the at least one of the tasks other than the given task by;

setting a particular time value as a current time value minus a time value when the scheduling method processor last updated the task-remaining time for the at least one of the tasks other than the given task;

where a currently active task is found within a task-remaining time manager storage, looking up the task-remaining time for the currently active task within the task-remaining time manager storage;

subtracting the task-remaining time for the currently activate task from the particular time value;

subtracting the task-remaining time for the currently active task from a left time value foe the currently active task and storing as the task-remaining for the currently active task within the task-remaining time manager storage;

moving the currently active task to a bottom of a list of the tasks;

where the particular time value is greater than a predetermined time slice constant, retrieving a select task at a top of the list of the tasks;

looking up the task-remaining time for the select task at the top of the list of the tasks;

subtracting the predetermined time slice constant from the task-remaining time for the select task at the top of the list of the tasks;

storing the task-remaining time for the select task at the top of the list of the tasks, as from which the predetermined time slice constant has been subtracted, within the task-remaining time manager storage;

subtracting the predetermined time slice constant from the particular time value; and, moving the select task to the bottom of the list of the tasks.

* * * * *